United States Patent [19]
Lim

[11] Patent Number: 5,925,934
[45] Date of Patent: Jul. 20, 1999

[54] LOW COST AND HIGHLY RELIABLE CHIP-SIZED PACKAGE

[75] Inventor: Thiam Beng Lim, Singapore, Singapore

[73] Assignee: Institute of Microelectronics, Singapore

[21] Appl. No.: 08/582,744

[22] Filed: Jan. 4, 1996

[30] Foreign Application Priority Data

Oct. 28, 1995 [SG] Singapore ............................ 9501666-3

[51] Int. Cl.⁶ ........................... H01L 23/48; H01L 23/50; H01L 23/28

[52] U.S. Cl. .......................... 257/778; 257/737; 257/738; 257/673; 257/670; 257/787; 257/693; 228/180.22; 174/52.4

[58] Field of Search ..................................... 257/787, 734, 257/735, 737, 738, 707, 693, 686, 778, 723, 490, 678, 670, 673; 174/52.4; 228/180.22, 179.1, 180.1, 180.2

[56] References Cited

U.S. PATENT DOCUMENTS

| | | | |
|---|---|---|---|
| 5,019,673 | 5/1991 | Juskey et al. | 257/778 |
| 5,120,678 | 6/1992 | Moore et al. | 228/180.2 |
| 5,274,913 | 1/1994 | Grebe et al. | 29/840 |
| 5,461,197 | 10/1995 | Hiruta et al. | 257/787 |
| 5,468,995 | 11/1995 | Higgins, III | 257/697 |
| 5,483,421 | 1/1996 | Gedney et al. | 361/771 |
| 5,554,887 | 9/1996 | Sawai et al. | 257/737 |
| 5,641,113 | 6/1997 | Somaki et al. | 228/180.22 |
| 5,656,863 | 8/1997 | Yasunaga et al. | 257/787 |
| 5,666,008 | 9/1997 | Tomita et al. | 257/737 |
| 5,731,631 | 3/1998 | Yama et al. | 257/778 |

FOREIGN PATENT DOCUMENTS

| | | | |
|---|---|---|---|
| 52-77684 | 6/1977 | Japan | 257/778 |
| 2-189926 | 7/1990 | Japan | 257/737 |
| 2-307226 | 12/1990 | Japan | 257/778 |
| 3-94438 | 4/1991 | Japan | 257/787 |
| 3-104141 | 5/1991 | Japan | 257/787 |
| 5-82582 | 4/1993 | Japan | 257/738 |
| 6-151650 | 5/1994 | Japan | 257/737 |

OTHER PUBLICATIONS

Patent Abstract of Japan, vol. 95, No. 3, Apr. 28 1995 and JP 6–342794 A Mitsubishi Electric Corp., Dec. 1994, Japan.

*Primary Examiner*—Alexander Oscar Williams
*Attorney, Agent, or Firm*—Proskauer Rose LLP

[57] ABSTRACT

The invention is directed to a chip-sized package (CSP) and method for making a CSP which is simple to manufacture, less costly and more compact, thus being truly a chip-sized package. The inventive CSP has a chip that has an array of chip ports on an active surface, such as an array of solder or metal bumps or any other conductive material. The chip may be held in a cavity of a frame by a pair of frame tie-bars. An encapsulant encapsulates the chip and portions of the chip ports located near the active surface, leaving portions of the chip ports located away from the active surface exposed. Package ports, such as solder balls may be attached to the portions of the chip ports located away from the active surface and used to attach the CSP to a printed circuit board. Various methods are used to leave portions of the chip ports located away from the active surface exposed from the encapsulant. The encapsulant may be removed by laser or grinding to expose portions of the chip ports. Alternatively, prior to encapsulation, the chip ports are positioned to sit on a mold, so that removing the mold leaves exposed the portions of the chip ports that were in contact with the mold. The mold may have an array of mold bumps or mold pockets upon which the chip ports sit. Removing the mold, exposes portions of the chip ports and leaves an array of openings in the encapsulant. Another method to form the array of openings in the encapsulant and expose portions of the chip ports uses an array of pins that are inserted in the encapsulant before it cures. The pins are inserted to contact the chip ports. Retracting the array of pins forms the array of openings in the encapsulant and exposes portions of the chip ports that were in contact with the pins.

10 Claims, 12 Drawing Sheets

FIG. 10C

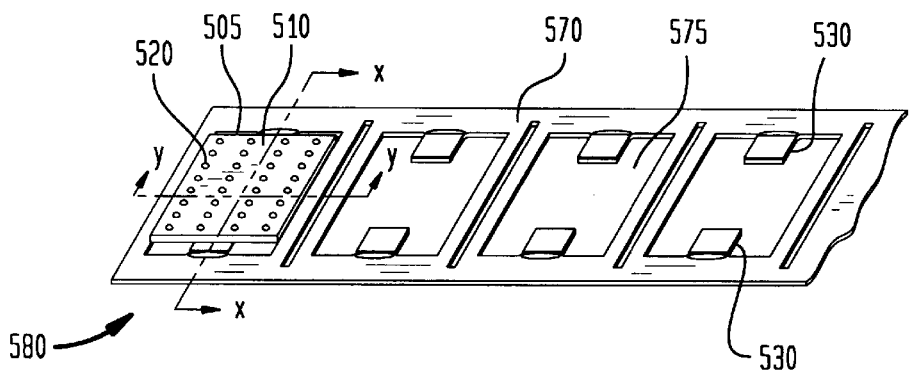
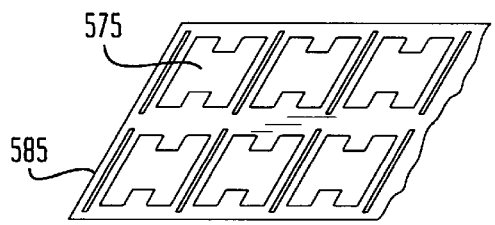
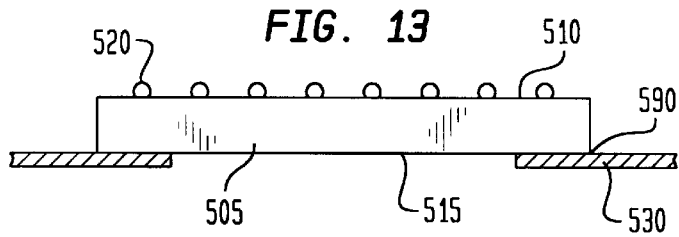
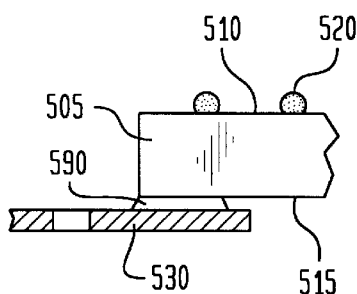
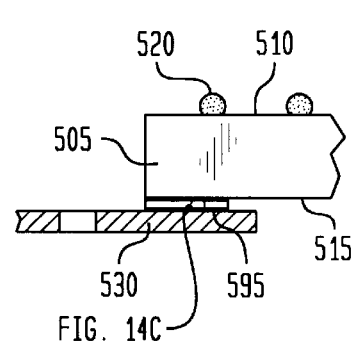
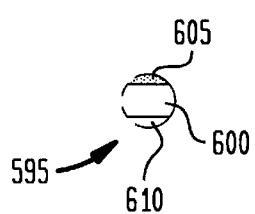

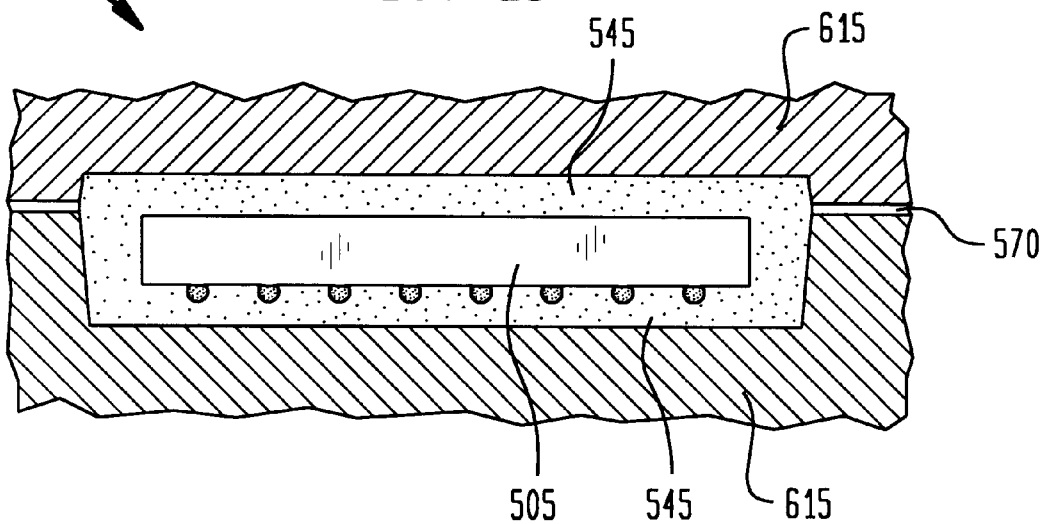
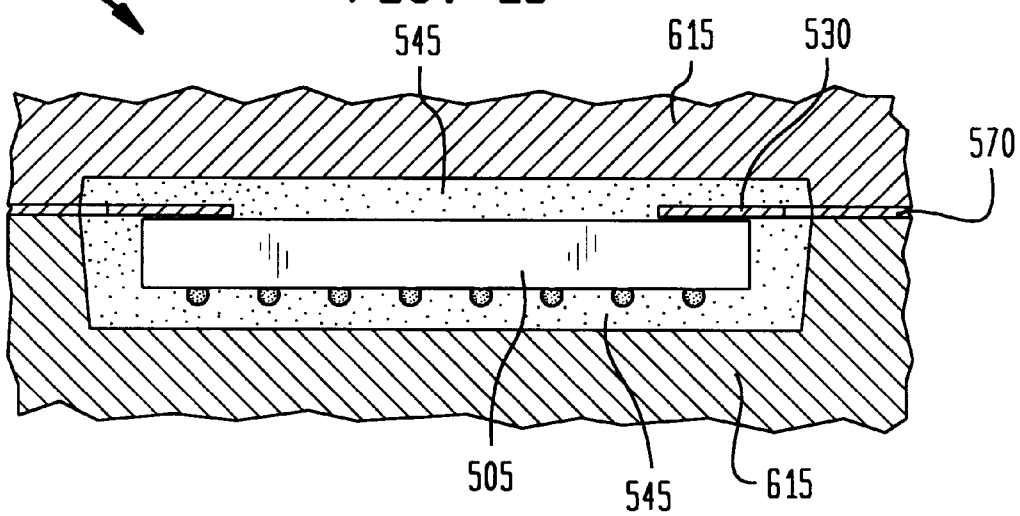

LOW COST AND HIGHLY RELIABLE CHIP-SIZED PACKAGE

RELATED APPLICATION

The following patent applications are assigned to the assignee hereof and contain subject matter related to the subject matter of the present patent application:

1. U.S. patent application Ser. No. 08/582,745, entitled "Highly Reliable And Planar Ball Grid Array Package", filed on even date herewith for Kishore Kumar CHAKRAVORTY and Thiam Beng LIM;
2. U.S. patent application Ser. No. 08/582,746, entitled "Apparatus For Dispensing Fluid In An Array Pattern", filed on even date herewith for Sarvotham M. BHANDARKAR, Kishore Kumar CHAKRAVORTY, Tai Chong CHAI and Jian Hua WU; and
3. U.S. patent application Ser. No. 08/582,643, entitled "IC Packaging Lead Frame For Reducing Chip Stress And Deformation", filed on even date herewith for Thiam Beng LIM and Sarvotham M. BHANDARKAR; The contents of the above-listed patent applications are incorporated herein by reference.

FIELD OF THE INVENTION

The present invention relates to a low cost and highly reliable chip-sized package (CSP) used, for example, in the manufacture of electronic packaging of Integrated Circuits (ICs). More particularly, the inventive CSP does not have a substrate, thus allowing for more compact sized CSPs which are less costly and simpler to manufacture.

BACKGROUND OF THE INVENTION

An integrated circuit or chip has input/output (I/O) connections in order to function as an electronic circuit. Many of these chips have more than 200 I/O connections. These I/O connections are attached, e.g., soldered, to a printed wiring board (PWB) or a printed circuit board (PCB).

In conventional packaging using peripheral-leaded surface mounted packages, such as peripheral leaded QFPs (Quad Flat Packs), wire bonding to a metallic lead frame is used to connect the I/Os of the IC chip to the I/Os of the QFP. The I/Os of the QFP are distributed along the periphery of the QFP. The maximum number of QFP I/Os distributed along the QFP periphery is limited to prevent the spacing between adjacent QFP I/O leads from becoming so small as to pose a potential electrical shorting problem during solder reflow at board mounting. FIGS. 1a and 1b illustrate a typical QFP, known as PQFP (Plastic Quad Flat Pack) 10, showing the pins or leads 15 that are bent to extend horizontally from the periphery of the PQFP.

For high I/O count IC chips, Ball grid array (BGA) packages have been used that can have more I/Os than QFPs. BGAs connect to PWBs or PCBs using balls instead of pins or leads. Typically, the I/O interconnects of the IC chip are brought out to land sites arranged in an array pattern on the bottom face of the substrate of the BGA package. Solder bumps or balls are attached to these land sites. These solder bumps or balls, in turn, provide the I/O connections of the BGA package. (IC packages utilizing such solder bumps or balls are described in the above-identified related applications.) Such a configuration allows an increase in the number of I/O interconnects over conventional QFP packages, in which the I/O interconnects are distributed along the periphery of the QFP package.

FIG. 2a shows a typical BGA package 20 with an overmolded encapsulant 25. A silicon IC chip 30 is mechanically attached to a substrate 35 via a die attach 40. The overmolded encapsulant 25 covers the chip 30 and portions of the top surface 45 of the substrate 35. As in conventional QFP packaging, the interconnect from the silicon IC chip 30 to the substrate 35 is typically by wire bonds 50.

The I/Os of the chip 30 are routed to the bottom surface 55 of the substrate 35 through metal conductors (not shown) embedded in the substrate 35. I/Os of the chip 30 are connected to these embedded conductors by the bond wires 50. In addition, through going vias 60, and thermal vias 65 used for heat transfer, may also be formed between the top and lower surfaces 45, 55 of the substrate 35. The going-through vias 60 may be interconnect vias, and may serve to relieve mechanical stress.

The I/Os of the BGA package 20 are an array of solder balls 70 located at the bottom surface 55 of the substrate 35. FIG. 2b shows a bottom view of the BGA package 20, wherein the array of solder balls 70 attached to the bottom surface 55 is shown.

The size of the BGA package 20 is considerably larger than the size of the IC chip 30. This is mainly due to the substrate 35. More advanced BGA packages have a small sized substrate due to the use of flip-chip type of chip-to-substrate interconnects, in lieu of wire bonding. FIGS. 3 and 4 show such smaller sized BGA packages, sometimes referred to in the industry as micro-BGA packages.

FIG. 3 shows a plastic BGA package 80 with a solder bumped flip chip. The IC chip 30 is connected to the substrate 35 via an array of solder balls 85 located between the bottom surface of the IC 30 and a portion of the upper surface 45 of the substrate 35. The remaining portion of the upper surface 45 of the substrate 35 is covered by an insulated plated copper conductor 90. The array of solder balls 85 is encapsulated by an underfill encapsulant compound 95.

The array of BGA solder balls 70, attached to the bottom surface 55 of the substrate 35, is used to connect the BGA package 80 to the PWB (Printed Wire Board) or PCB (Printed Circuit Board) (not shown). The portion of the bottom surface 55 not covered by the array of BGA solder balls 70, is covered by a layer of solder mask 100. The substrate 35 may have signal/ground vias 105 between the insulated plated copper conductor 90 and the layer of solder mask 100. In addition, the substrate 35 may have thermal/ground vias 110 between the underfill encapsulant compound 95 and the layer of solder mask 100.

FIG. 4 shows another BGA package known as SLICC (Slightly Larger than IC Carrier) BGA package 120 from Motorola. The SLICC BGA package 120 has a small SLICC substrate 35 which may be an organic interface. The SLICC substrate 35 is slightly larger in area than the IC chip 30. The IC chip 30 is connected to the substrate 35 by interconnections sometimes known as C4 interconnections 125, which are encapsulated by an underfill compound 95. FIG. 4 also shows a PCB 130 (or PWB) upon which the array of BGA solder balls 70 is attached.

The continuous quest for smaller IC packages has led to the introduction of a class of packages known as chip-sized packages (CSPs). These CSP packages have form factors marginally larger than the size of the silicon IC chip. In CSP packages, a substrate is not necessary. This allows the CSP package form factor to be further reduced such that it is only marginally larger than the IC chip itself. Several configurations have been proposed and these are shown in FIGS. 5–9.

FIGS. 5a–5c show a Tessera Compliant Chip (TCC) package 150. As shown in FIG. 5a, the IC chip 30 is attached to an elastomer compliant layer 155 via a flex circuit 160. The elastomer compliant layer 155 has an array of Ni/Au bumps 165 which connects the compliant layer 155 to the substrate 35. The IC chip 30 and flex circuit 160 are encapsulated in an encapsulant compound or casing 175. Alternatively, as shown in FIG. 5b, the IC chip 30 and flex circuit 160 are not encapsulated. FIG. 5c shows the flex circuit 160 and the array of bumps 165 of FIG. 5b in greater detail. The flex circuit 160 comprises fan-in tab leads 175 which extend from the periphery of the compliant layer 155 and connect to pads 180 on the active surface 185 of the chip 30.

FIG. 6 is a fine pitch BGA package 200 from NEC showing the IC chip 30 which is located over an interface layer 205. In turn, the interface layer 205 is mechanically attached to a carrier 210 via an adhesive 215. The interface layer 205 has interface ports 220 which are distributed on the active surface 225 of the chip 30. These interface ports 220 act as the I/Os of the chip 30. The interface ports 220 are electrically connected to carriers protrusions 230 that extend toward the interface ports 220. The carrier 210 has a layer 235 on which bumps and metal lines are deposited to form the protrusions 230, solder bumps 240 and metal lines 245. The solder bumps 240 and the protrusions 230 are on opposite surfaces of the metal lines 245. The solder bumps 240 are in electrical contact with the carriers protrusions 230 through the metal lines 245 and act as the I/O ports of the fine pitch BGA package 200.

FIG. 7 shows a CSP 250 made by Matsushita having the IC chip 30 attached to a ceramic substrate 260 via an array of solder bumps 270. Sealing resin 280 encapsulates the array of solder bumps 270, the sides of the IC chip 30 and the top surface of the substrate 260. The substrate 260 has vertical via holes 290 therethrough. An array of land sites 295 are located at the bottom surface 292 of the substrate 260, onto which solder balls (not shown) may be attached.

FIG. 8 shows a CSP 300 made by Fujitsu which uses a lead frame 310 as the I/Os of the CSP 300. The lead frame 310 is connected to the I/Os of the IC chip 30 by bonding wires 320. A protection film 330 separates and attaches the lead frames 310 to the IC chip 30. Sealing resin 340 encapsulates the sides of the IC chip 30, the wires 320 and portions of the lead frames 310, leaving a lower portion of the lead frames 310 exposed.

FIGS. 9a–9d show a process for making a CSP 400 (FIG. 9d) which is shown in greater detail in FIG. 9e. The CSP 400 is made by Mitsubishi. As shown in FIG. 9a, the IC chip 30 has Pb/Sn solder interconnecting bumps 405 on its active surface 410. The IC chip 30 is mounted on its active surface 410 to a carrier base frame 415 which also has frame bumps 420. The interconnecting bumps 405 of the chip 30 are bonded to corresponding frame bumps 420 of the frame 415. In the mounted position, the inactive surface 425 of the chip 30, which is opposite the active surface 410, is also shown in FIG. 9a.

As shown in FIG. 9b, the bonded chip 30 and portions of the frame 415 are encapsulated with a resin 430 by a molding process identical to that used in conventional molding of IC packages. This is accomplished by placing the chip 30 in a mold 435 having cavities and thereafter pouring resin 430 into the mold 435 to fill the mold cavities. FIG. 9b shows a section of a mold 435 which is used to encapsulate the chip 30 with the resin 430.

Next, as shown in FIG. 9c, the base frame 415 is separated from the encapsulated chip 30 in a way that transfers the frame bumps 420 from the frame 415 to the chip 30. This results in an encapsulated chip 30 that has transferred frame bumps 420 which have exposed lower surfaces 440. Finally, as shown in FIG. 9d, solder balls 450 are attached to the exposed lower surfaces 440 (FIG. 9c) of the transferred frame bumps 420. The solder balls 450 act as external I/O electrodes of the CSP 400.

FIG. 9e shows in greater detail the chip 30 with an external electrode bump 450. The chip 30 has an electrode pad 455 at its active surface 410. Wiring conductors 460, which form a pattern, are connected to the electrode pad 455. The Pb/Sn solder 405 is attached to the wiring conductor 460. The Pb/Sn solder 405 surrounds the transferred frame bump 420. The resin encapsulant 430 covers the active surface 410 of the chip 30, leaving exposed the lower portion 440 of the transferred frame bump 420 whereon the external electrode bump 450 is attached. A polyimide film 470 separates the resin 430 from the wiring conductor 460.

Although the CSPs shown in FIGS. 5a–9e are smaller than the BGAs shown in FIGS. 2a–4, the conventional CSPs and BGAs have complex structures which are costly and difficult to manufacture. Furthermore, some of the conventional CSPs still have a substrate, or a substrate-like structure which is larger than the IC chip itself.

Accordingly, it is an object of this invention to provide a CSP and method for making a CSP in which the substrate and other intermediate processes are eliminated.

Another object of this invention is to provide a CSP which has enhanced miniaturization, due to the absence of the substrate, and thus is truly a chip-size package, having a size which is approximately the same size as the IC chip.

Yet another object of this invention is to provide a CSP and method for making thereof which are less costly and simple to manufacture as all the processes used are established practices in electronic packaging.

SUMMARY OF THE INVENTION

The invention is directed to a chip-sized package (CSP) and a method for making a CSP which is simple to manufacture and compact, thus being truly a chip-sized package.

In an illustrative embodiment of the invention, the inventive CSP has a chip that has an array of chip ports, such as an array of solder or metal bumps. The chip ports are on an active surface of the chip. Illustratively, the chip may be held on a frame by a pair of frame tie-bars. An encapsulant encapsulates the chip and portions of the chip ports located nearest the active surface, leaving portions of the chip ports exposed from the encapsulant. The exposed portions of the chip ports are located away from the active surface.

Package ports, such as solder balls may be attached to the array of chip ports and used to attach the CSP to a printed circuit board. Various methods are used to leave portions of the chip ports exposed. For example, portions of the encapsulant covering the chip ports may be removed by laser or grinding to expose portions of the chip ports located away from the active surface.

Alternatively, prior to encapsulation, the array of chip ports is positioned to sit on a mold, so that removing the mold after encapsulation exposes from the encapsulant the portions of the chip ports that were in contact with the mold. The mold may have an array of mold bumps or pockets upon which the array of chip ports sit. In this case, removing the mold exposes portions of the chip ports that were in contact with the mold bumps or pockets. This leaves an array of openings in the encapsulant. The exposed portions of the chip ports are located away from the active surface.

Another illustrative method to form the array of openings in the encapsulant and expose portions of the chip ports located away from the active surface uses an array of pins that are inserted in the encapsulant before it cures. The array of pins are inserted to contact portions of the chip ports located away from the active surface. Retracting the array of pins forms the array of openings in the encapsulant and exposes the portions of the chip ports located away from the active surface. Exposing the chip ports allows the package ports to be deposited onto the chip ports. The package ports serve as electrical connections to the chip.

BRIEF DESCRIPTION OF THE DRAWING

FIG. 1b is a top view of the conventional PQFP shown in FIG. 1a;

FIG. 2b is a bottom view of the conventional plastic BGA package shown in FIG. 2a;

FIGS. 11–16 illustrate a process for forming the CSP according to the invention;

DETAILED DESCRIPTION OF THE INVENTION

Figure 1A:
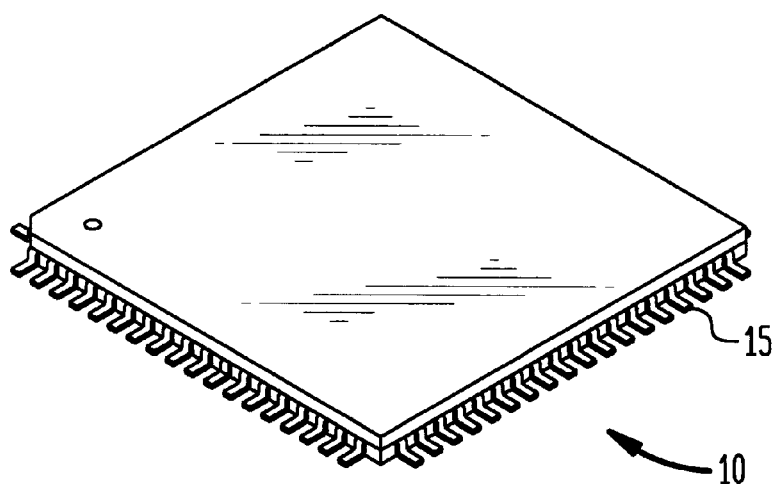
FIG. 1a is a isometric view of a conventional PQFP.
Figure 1B:
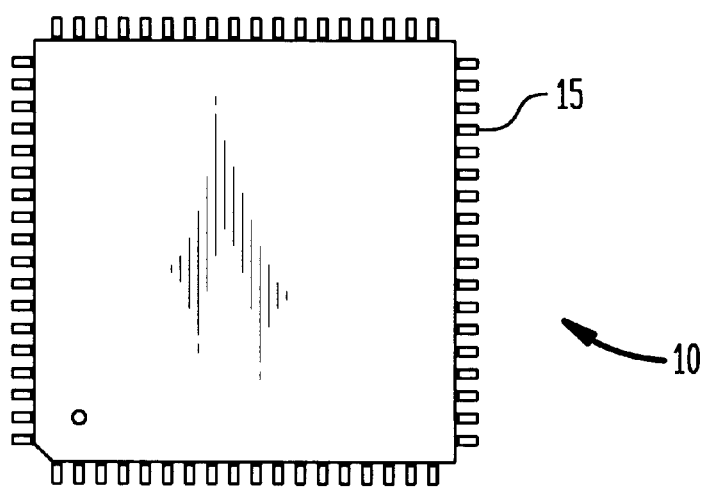
Figure 2A:
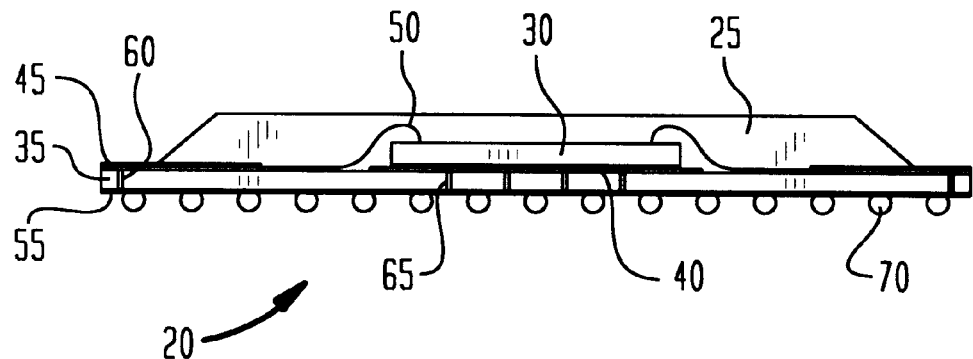
FIG. 2a is a cross sectional view of a conventional plastic BGA package.
Figure 2B:
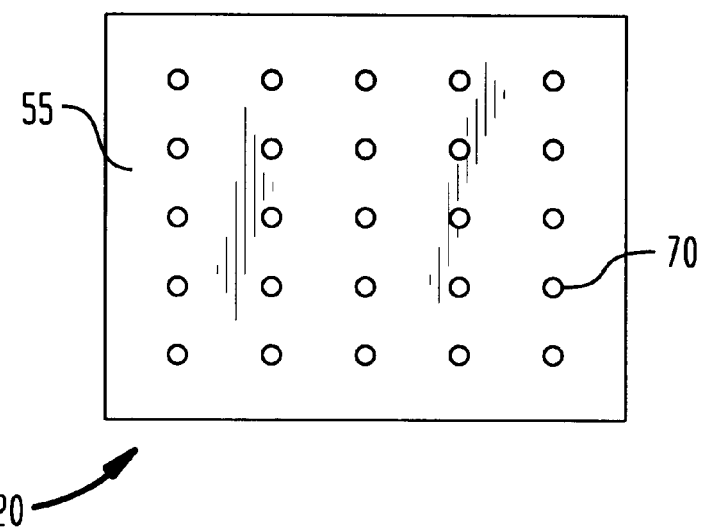
Figure 3:
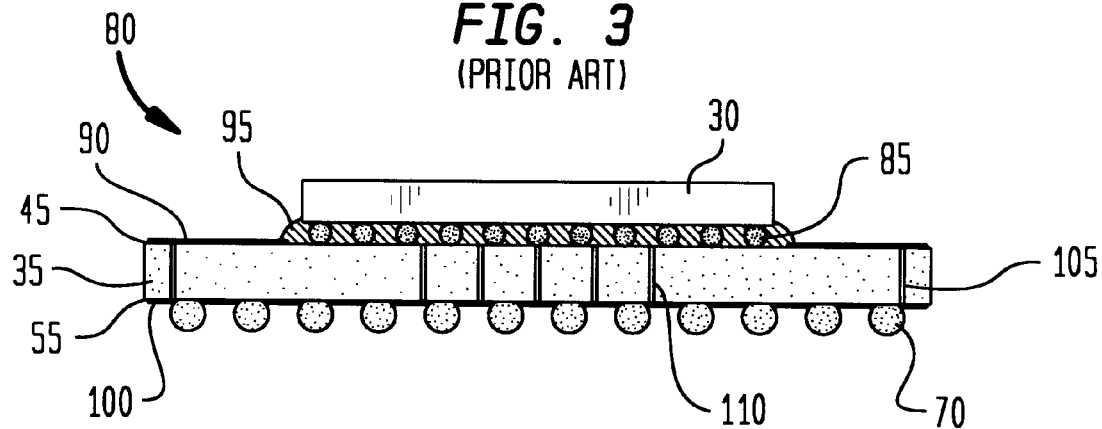
FIG. 3 is a cross sectional view of another conventional plastic BGA package having a solder bumped flip chip.
Figure 4:
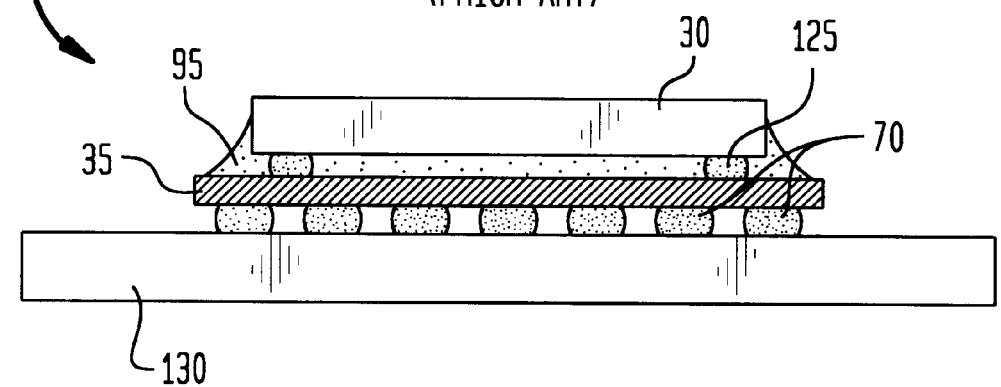
FIG. 4 is a cross sectional view of a conventional SLICC package.
Figure 5A:
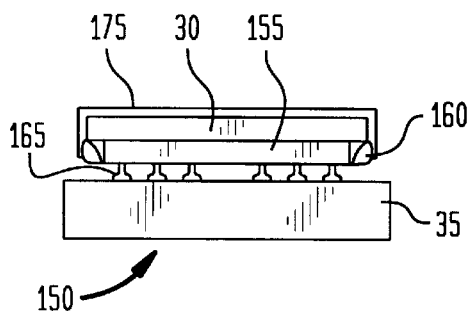
FIGS. 5a–5b are cross sectional views of a conventional TCC package with and without an encapsulant, respectively.
Figure 5B:
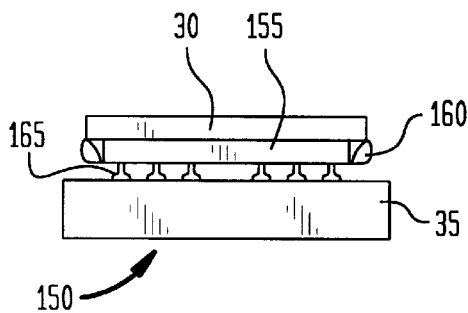
Figure 5C:
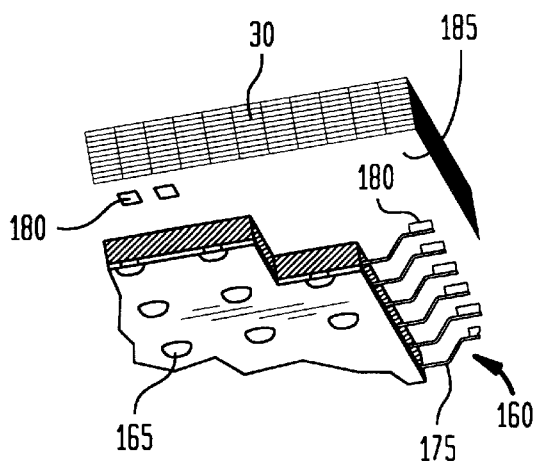
FIG. 5c is a detailed view of the conventional TCC shown in FIG. 5b.
Figure 6:
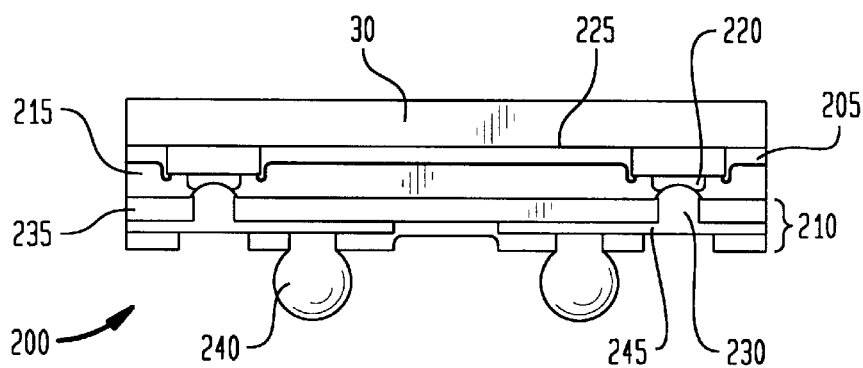
FIG. 6 is a cross sectional view of a conventional fine pitch BGA package.
Figure 7:
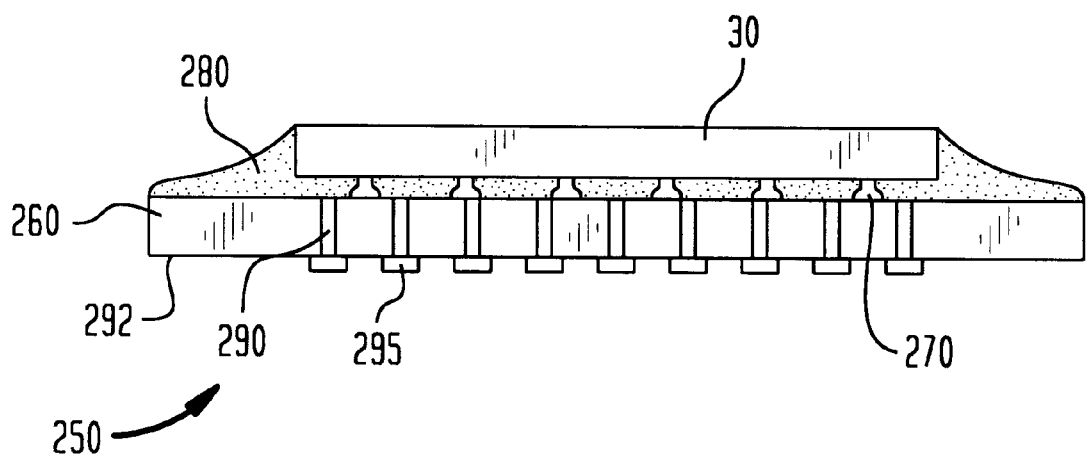
FIG. 7 is a cross sectional view of a conventional CSP using ceramic substrate.
Figure 8:
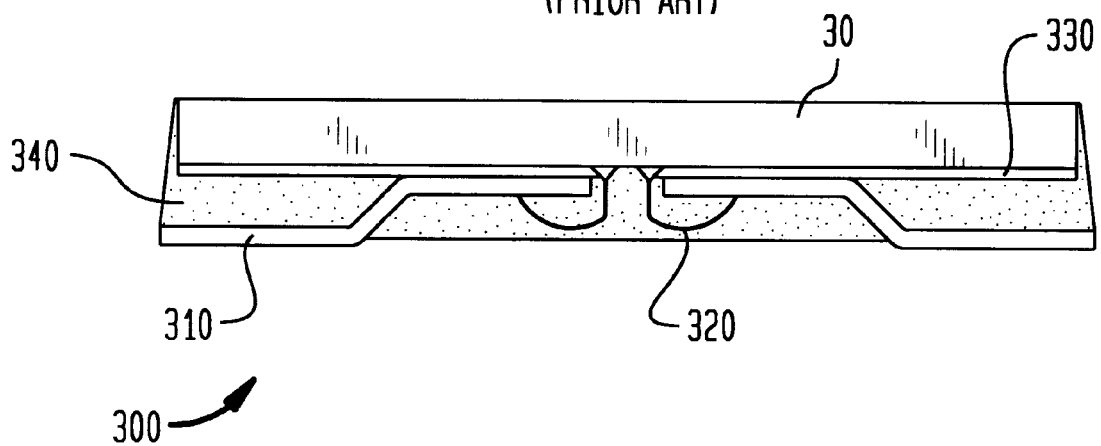
FIG. 8 is a cross sectional view of a conventional CSP using lead frame.
Figure 9A:
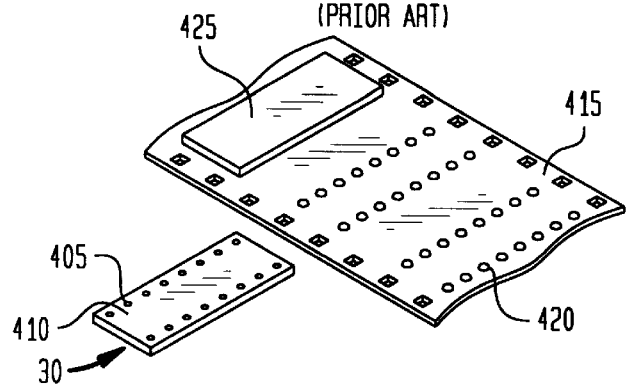
FIGS. 9a–9d show a process for making a conventional CSP having external electrode bumps.
Figure 9B:
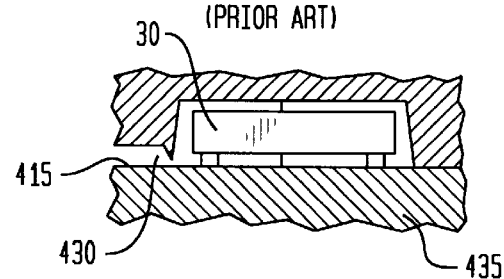
Figure 9C:
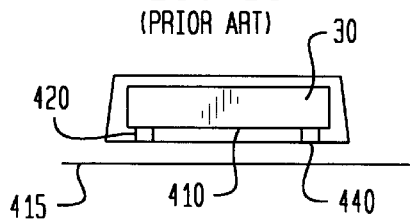
Figure 9D:
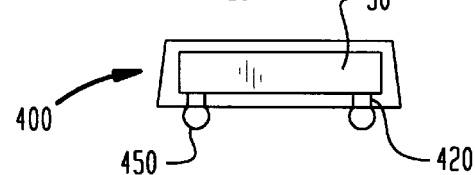
Figure 9E:
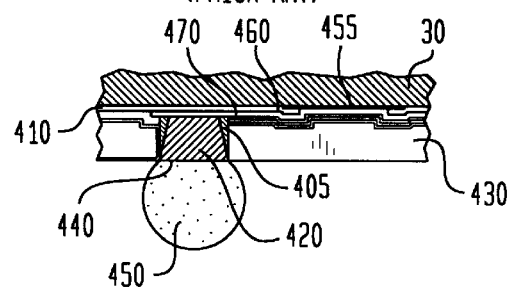
FIG. 9e is a detailed cross sectional view of the CSP shown in FIG. 9d.
Figure 10A:
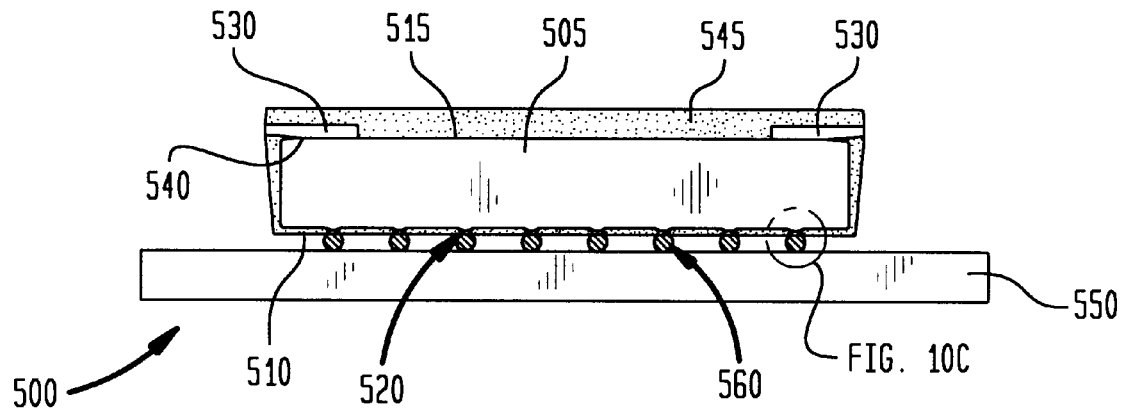
FIG. 10a is a cross section of a CSP according to an illustrative embodiment of the present invention.

FIG. 10a shows a cross section of a CSP 500 according to an illustrative embodiment of the present invention. The inventive CSP 500 includes a chip 505 that has an active surface 510 and an inactive surface 515. The active and inactive surfaces 510, 515 are opposite each other. Chip interconnect ports, such as chip interconnect bumps 520 (or balls) arranged in an array have their upper surfaces attached to the active surface 510 of the chip 505. The chip interconnect bumps 520 are made of conductive material and act as the I/O ports of the chip 505. Illustratively, the chip interconnect bumps 520 are of solder material, such as Pb/Sn solder. However, other conductive materials, such as a metal having similar properties as solder material, or conductive polymer material suitable for interconnection may be used.

Two metallic frame tie-bars 530, which are positioned opposite each other, are attached to the inactive surface 515 via a die attach 540. The tie-bars 530 are severed from a frame, which has a cavity for receiving the chip 505, as will be explained in connection with the process for making the CSP 500. The tie-bars 530 hold the chip 505 within the frame cavity.

A molding compound 545, such as epoxy or resin, encapsulates the chip 505, the metallic frame tie-bars 530, and the array of chip interconnect bumps 520 except for leaving the lower surfaces 525 (FIG. 10b) of the chip interconnect bumps 520 exposed. A second array of package interconnect ports made of conductive materials, such as package interconnect balls (or bumps or columns) 560, e.g., solder balls, are deposited and attached to the exposed lower surfaces 525 (FIG. 10c) of the chip interconnect ports (e.g., solder bumps or columns) 520. The package interconnect balls 560 act as the I/O ports of the CSP 500 and are used for connection to a PWB or a PCB 550. The size of each chip interconnect bump 520 and package interconnect ball 560 depend on design specifications.

Alternatively, the array of package interconnect balls or columns 560 is not attached to the array of chip interconnect bumps 520 of the CSP 500. In this case, the array of chip interconnect bumps 520 is directly attached to the PWB 550 as follows. Solder paste may be printed on the PWB 550 corresponding to the location of the chip interconnect ports (e.g., solder bumps) 520 on the CSP 500, followed by mounting the CSP 500 on the PWB 550 and a solder reflow process, as in conventional surface mount technology (SMT).

Figure 10B:
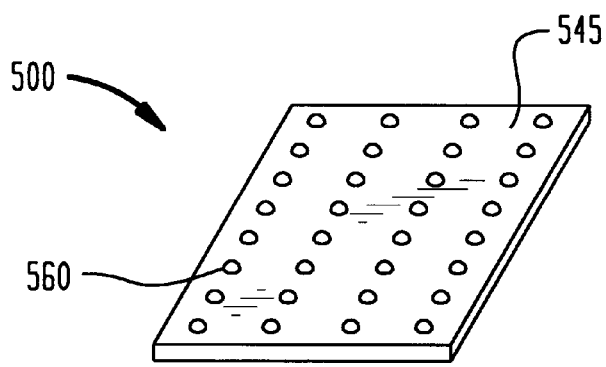
FIG. 10b is an isometric view showing package interconnect ports of the CSP shown in FIG. 10a according to the present invention.
Figure 10C:
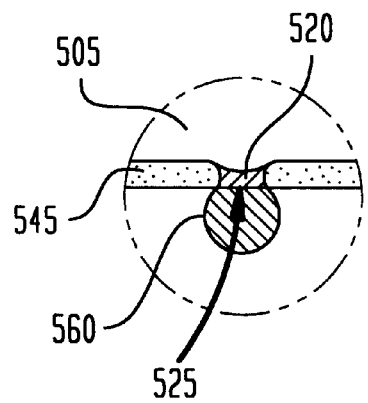
FIG. 10c is a detailed cross sectional view of the connection between a chip interconnect port and a CSP package interconnect port according to the present invention.

FIG. 10b is an isometric view of an encapsulated CSP 500 showing the molding compound 545 and package interconnect balls or bumps 560. FIG. 10c shows in greater detail the connection between the interconnect ports 520 of the chip 505 and the package interconnect ports 560. As shown in FIG. 10c, the package interconnect ports 560 are deposited or attached to the lower surfaces 525 of the chip interconnect ports 520.

The process for making the inventive CSP 500 will now be described. FIG. 11 shows the starting point for the inventive method according to an illustrative embodiment. The chip 505 is mounted in a frame 570, which is made by forming a cavity or cut-out 575 in a strip 580. The size of the cavity 575 corresponds to the size of the CSP 500 (FIG. 10a). Typically, the strip 580 has multiple cavities 575 for mounting multiple chips 505. As shown in FIG. 12, instead of the strip 580, an array of cavities 575 may be arranged in a plate 585. Thus, using the inventive method, multiple chips 505 may be used with the strip 580 or the plate 585 to simultaneously yield multiple CSPs 500 (FIGS. 10a and 10b). For simplicity, the following describes the inventive method for making a single CSP 500. However, it is understood that multiple CSPs 500 may be simultaneously manufactured using the strip 580 or plate 585.

Illustratively, the frame 570 is metallic and made of the same material that is commonly used for the lead frame used in conventional packaging and is known to persons skilled in this art. (IC packages utilizing such a lead frame are described in the above-identified related application entitled "IC Packaging Lead Frame For Reducing Chip Stress And Deformation".) Illustratively, the frame 570 is made of a nickel-iron alloy or a copper alloy. No leads are required on the frame 570 since interconnection is via the array of interconnect ports, such as the chip interconnect bumps 520 (or balls).

The frame 570 has two tie-bars 530 extending into opposite sides of the cavity 575. The tie-bars 530 support the silicon chip 505 in the cavity or cut-out 575 when the chip 505 is mounted on the frame 570. Additional tie-bars may be used to ensure stability of the chip 505 during handling, and especially during the encapsulation process.

A pre-bumped chip 505 having an array of interconnect ports, (such as chip interconnect bumps or balls 520), on its active surface 510 is mounted in the cavity 575 of the frame 570. The inactive surface 515 (FIG. 10a) of the chip 505 is placed on the tie-bars 530 which support the chip 505 in the cavity 575. Alternatively, the active surface 510 of the chip 505 is placed on the tie-bars 530. FIG. 13 is a cross section along the line X—X of FIG. 11 showing the inactive surface 515 of the chip 505 attached to the tie-bars 530. FIG. 13 also shows the active surface 510 (which is opposite the inactive surface 515) of the chip 505, having the array of interconnect ports, such as chip interconnect bumps 520 (or balls).

The inactive surface 515 may be mechanically attached to the tie-bars 530 using a liquid adhesive paste such as die attach 590, as in conventional packaging. FIG. 14a shows in greater detail the inactive surface 515 of the chip 505 attached to a tie-bars 530 via the die attach 590. Alternatively, the inactive surface 515 may be attached to the tie-bars 530 using a double-sided adhesive tape as in Lead-on-Chip (LOC) packaging. FIG. 14b shows in greater detail the inactive surface 515 of the chip 505 attached to a tie-bars 530 via a double-sided adhesive tape 595. The double-sided adhesive tape 595 may comprise three layers: an inner base film 600 and two outer adhesive films 605, 610 located on both sides of the inner base film 600. Alternatively, the adhesive tape may have only a single layer of adhesive without the inner base film 600.

The use of die attach 590 and the double-sided adhesive tape 595 is a conventional practice in the assembly of ICs. The advantage of the double-sided tape 595 (or the single layer adhesive tape) is that it can be pre-attached on the tie-bars 530 by the frame manufacturer. Upon attaching the chip 505, depending on the adhesive material, a curing process may or may not be required. This simplifies the chip mounting process. On the other hand, using the die attach 590, such as an adhesive paste, is equally acceptable, except that the paste requires a curing process.

The next step in manufacturing the inventive CSP 500 (FIG. 10a) is encapsulation. The strip 580 (of FIG. 11 or plate 585 of FIG. 12) of frames 570 holding a multiple chips 505 is encapsulated by a molding process in the same manner as in conventional packaging, needing no special tools and techniques. For example, as shown in FIG. 15, the chip loaded strip 580 (of FIG. 11 or plate 585 of FIG. 12) of frames 570 is placed inside a mold 615. The mold 615 has a cavity which receives the chip 505. Molding compound 545 is poured or injected into a space in the mold cavity that separates the chip 505 from the mold 615. After the molding compound 545 has cured, the mold 615 is removed.

FIGS. 15 and 16 are a cross section of along the lines Y—Y and X—X of FIG. 10 respectively, showing a fully encapsulated package 500' located within the mold 615 after the encapsulation step. FIG. 15 shows the chip 505 mounted on the frame 570 and fully encapsulated by the molding compound 545 which is poured or injected into the space between the chip 505 and the mold 615. The edges of the frame 570 act as a dam and prevent the molding compound 545 from leaking out of the cavity 575 (FIG. 11). FIG. 16 shows the tie-bars 530. The molding compound 545 may be similar to the type used in conventional chip packages. Illustratively, the molding compound 545 is epoxy resin based, and molded at approximately 180° C.

After the encapsulation step, wherein many chips 505 are encapsulated simultaneously in conjunction with the strip 580 (FIG. 11) or the plate 585 (FIG. 12), individual units or packages are obtained by excising them from the molded strip 580 (FIG. 11) or plate 585 (FIG. 12). To electrically attach the array of package ports, such as the interconnect balls (or bumps) 560, to the array of chip ports 520, portions of the encapsulated array of chip ports 520 are first exposed. The step of exposing the chips ports (e.g., the solder bumps) 520 may be performed before or after excising the individual packages from the molded strip 580 (FIG. 11) or plate 585 (FIG. 12). The array of chip ports 520 and the array of package ports 560 may be any conductive material besides solder, suitable for interconnection. For example, they may be made of conductive polymer material suitable for interconnection.

Figure 17A:
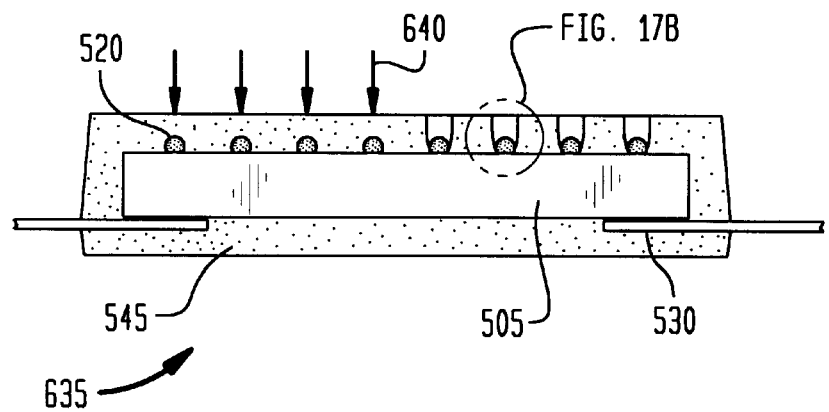
FIGS. 17a–17b illustrate a process for exposing a surface of the chip interconnect ports of the CSP according to the invention using a laser beam.
Figure 17B:
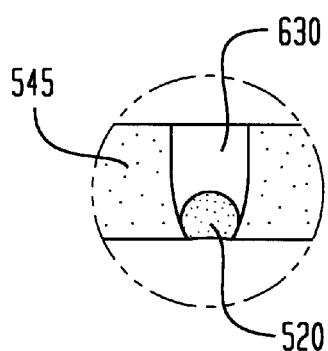

Several methods may be used to expose portions of the array of solder bumps 520 from the molding compound encapsulant 545. FIG. 17a shows a laser machining method for forming an array of openings 630 in the molding compound 545 to expose portions of the encapsulated array of chip ports, e.g., solder bumps 520. FIG. 17b shows one opening 630 in greater detail.

After molding, the encapsulated chip 635 is removed from the mold 615 (FIGS. 15 and 16). Next, the molding compound encapsulant 545 above each individual solder bump 520 on the chip 505 is fired on by a narrow laser beam, indicated by arrows 640, in order to expose the array of bumps 520. The laser beam technique is similar to that used in the marking of electronic packages. Such a technique is widely used as an alternative to ink marking.

For example, a single narrow laser beam 640 is individually applied to one of the bumps 520 in the array at any one time. One method to accomplish this is by mounting the laser on a movable arm (not shown) which is programmed to position the laser sequentially over each of the bumps 520 in the array. In another method, the laser may be stationary, but the package is on a movable platform (not shown) that sequentially positions each bumps 520 in the array in line with the laser beam 640. This process is repeated until all the bumps 520 in the array are exposed to the single narrow laser beam 640 to remove the molding compound encapsulant 545 from above the bumps 520.

Alternatively, the entire array may be fired on in a single pass using either several lasers or a single laser and a mask (not shown). The mask prevents removal of the molding compound encapsulant 545 from areas other than above the array of bumps 520.

Figure 18:
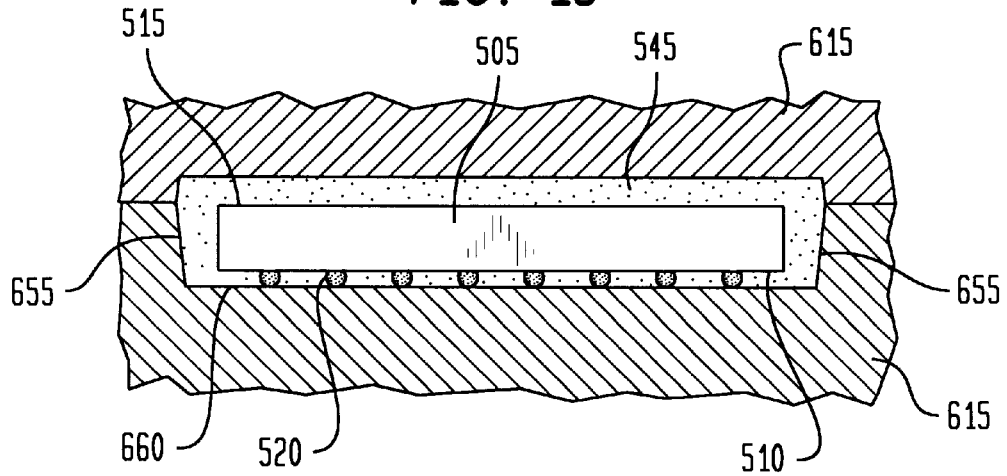
FIG. 18 illustrates a process resulting in exposed chip interconnect ports of the CSP according to the invention by positioning the chip to sit on a mold.

FIG. 18 shows a second method wherein the molding compound encapsulant 545 covers only portions of the array of solder bumps 520. The encapsulation step using this method leaves exposed portions of the array of solder bumps 520.

After positioning the inactive surface 515 of the chip 505 on the tie-bars 530 (FIG. 11), the array of bumps 520 on the active surface 510 is positioned in the mold 615 that has side and bottom walls 655, 660, respectively. The size of the mold 615 is such that the array of bumps 520 sits on the bottom wall 660 of the mold 615.

During encapsulation step, wherein the molding compound encapsulant 545 is poured or injected into the mold 615, the molding compound encapsulant 545 does not cover the portions of the array of bumps 520 that contact or sit on the bottom wall 660 of the mold 615. Thus, removing the mold 615 after the mold compound encapsulant 545 cures, leaves exposed the portion of the array of bumps 520 that were in contact with the bottom wall 660 of the mold 615. Remnants of the mold compound 545 may be cleaned up by a light laser process as described above in connection with the laser machining process.

Figure 19A:
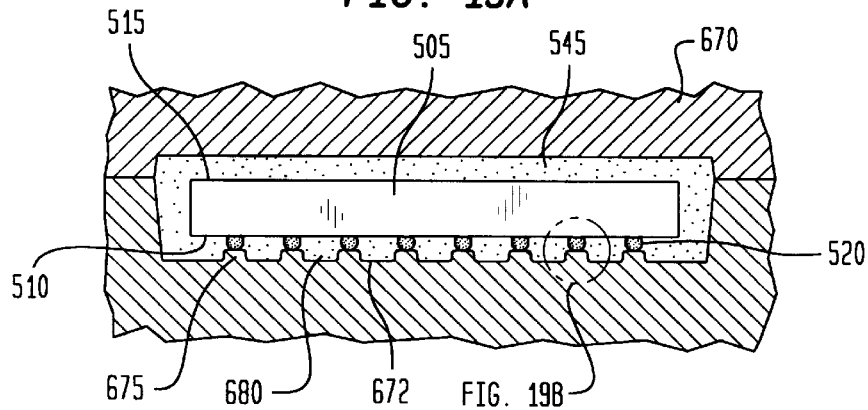
FIGS. 19a–19g illustrate a process resulting in exposed chip interconnect ports of the CSP according to the invention by positioning the chip to sit on a mold having an array of mold bumps.
Figure 19B:
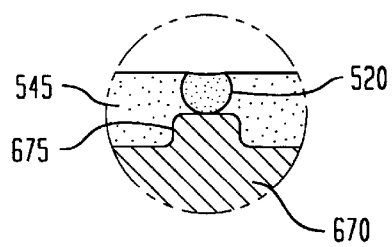

FIG. 19a shows a third method which results in exposed portions of the array of solder bumps 520. This method involves an alternate design of the bottom surface of a mold 670. FIG. 19a shows the mold 670 having a bottom surface 672 which has an array of mold bumps 675 machined thereon. The mold bumps 675 are separated from each other by pockets 680, which form an array of pockets. The array of mold bumps 675 corresponds to the array of solder bump 520 so that the solder bumps 520 of the chip 505 sit on the mold bumps 675. FIG. 19b shows in greater detail one of the solder bumps 520 sitting on one of the mold bumps 675.

Figure 19C:
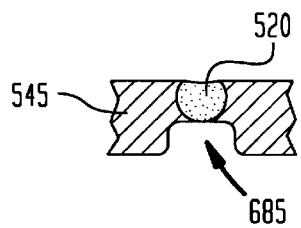

When the molding process is completed, i.e., after pouring or injecting the mold compound encapsulant 545 in the mold 670 and removing the mold 670 once the encapsulant 545 has cured, portions of the array solder bumps 520 on the chip 505, which portions that were in contact with the array of mold bumps 675, remain exposed. FIG. 19c shows in greater detail one of the solder bumps 520 surrounded by the mold compound 545 wherein a portion of the solder bumps 520 is exposed through an opening 685. Any remnants of the mold compound resin 545 that prevent exposure of the solder bumps 520 through the openings 685 may be cleaned up by a light laser process as described above in connection with the laser machining process.

Figure 19D:
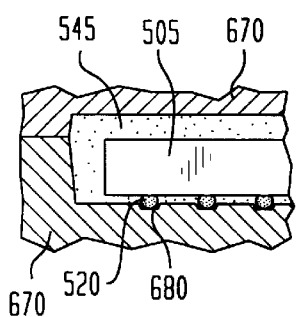
Figure 19E:
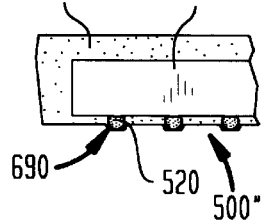

Alternatively, instead of using positioning the array of solder bump 520 on the array of mold bumps 675, FIG. 19d shows positioning the array of solder bump 520 on the array of pockets 680 of the mold 670. The mold compound 545 is poured or injected into the space between the mold 670 and the chip 505. FIG. 19e shows a CSP package 500" which has been removed from the mold 670 (FIG. 19d). The CSP package 500" has a stepped active surface 690. Portions of the array solder bumps 520 on the chip 505 of the CSP package 500", which portions that were in contact with the array of mold pockets 680, remain exposed.

Figure 19F:
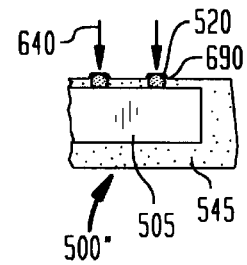
Figure 19G:
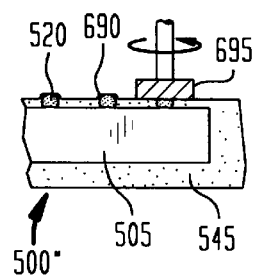

As shown in FIG. 19f, any remnants of the mold compound resin 545 may be cleaned up by a light laser process as described above in connection with the laser machining process, wherein a laser beam 640 is used to remove the molding compound encapsulant 545 from above the bumps 520. As shown in FIG. 19g, if a smooth CSP active surface is desired with exposed solder bumps 520, the stepped surface 690 of the CSP 500" is ground by rotating a grinding wheel 695, as described further in connection with FIG. 20.

Figure 20:
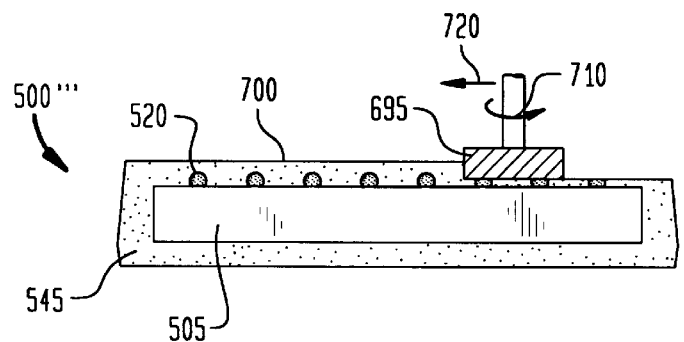
FIG. 20 illustrates a process for exposing a surface of the chip interconnect ports of the CSP according to the invention using grinding.

FIG. 20 shows a fourth method to expose portions of the array of solder bumps 520 from the molding compound encapsulant 545 which involves grinding. After fully encapsulating the chip 505 with the molding compound encapsulant 545 (as shown in FIGS. 15 and 16), the entire bottom surface of the package 500'" is ground by a mechanical process, e.g., by rotating the grinding wheel 695, as indicated by arrow 710, and moving the grinding wheel 695 across the entire bottom surface 700 of the package 500'" as indicated by arrow 720. This exposes the array of solder bumps 520.

Figure 21A:
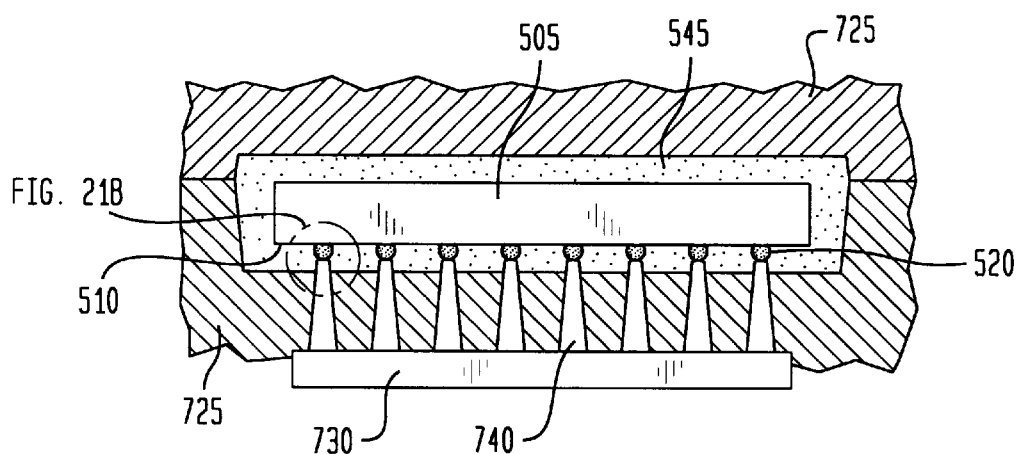
FIGS. 21a–21c show a process that leaves portions of the chip interconnect ports of the CSP exposed according to the invention using a mold that has retractable pins.
Figure 21B:
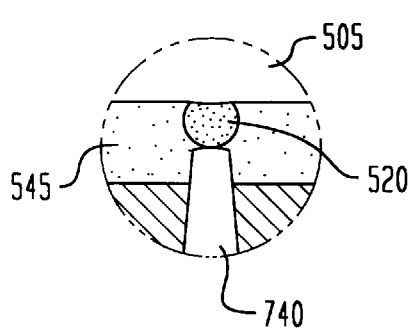
Figure 21C:
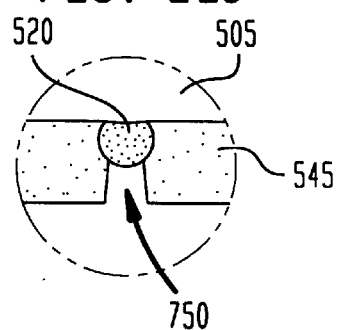

FIGS. 21a–21c show a fifth method that leaves exposed portions of the array of solder bumps 520 after the encapsulation step which involves using an a mold that has an array of retractable pins. FIG. 21a shows a mold 725 having a member 730 that holds an array of retractable pins 740. The chip 505 is enclosed in the mold 730 and the array of retractable pins 740 is positioned so that each retractable pin 740 is located in front of a corresponding solder bump 520.

After the mold compound encapsulant 545 is poured or injected into the mold 725, and while the mold 725 is still closed, the array of pins 740 is moved toward the active surface 510 of the chip 505, until the pins 740 contact the solder bump 520. FIG. 21b shows in greater detail one of the pins 740 pushed through the mold compound encapsulant 545 to contact one of the solder balls 520. This punctures the mold compound encapsulant 545. As shown in FIG. 21c, removing or retracting the array of pins 740 from the mold compound encapsulant 545 leaves an array of openings 750 therein. This exposes portions of the array of solder bumps 520 that were in contact with the pins 740. Remnants of the mold compound resin 545 may be cleaned by a light laser process as described above in connection with the laser machining process.

Figure 22:
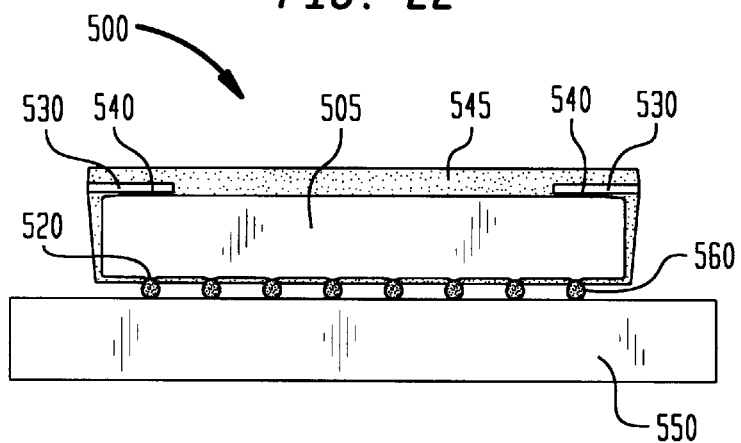
FIG. 22 shows a process that attaches CSP interconnect ports to the exposed portions of the chip interconnect ports according to the invention.

As shown in FIG. 22, after exposing portions of the array of solder bumps 520 using one of the five above described methods, the array of package ports, such as the interconnect solder balls (or bumps) 560, is electrically attached to the exposed portions of the array of solder bumps 520. The array of solder balls 560 is attached using established methods of solder ball attachment used in BGA packaging. Attachment of the array of solder balls 560 at this stage is optional. It may be desirable not to attach the array of solder balls 560 at this stage since, without the solder balls 560, the CSP 500 is more amenable to handling for electrical testing.

The array of solder balls 560 is used to attach the CSP 500 to the PCB or PWB 550 using a solder reflow process, as in conventional surface mount technology (SMT).

Alternatively, instead of using solder balls 560, solder paste may be screen printed on the PWB 550, as in conventional surface mount technology, in an array corresponding to the array solder bumps 520. The CSP, which does not have an array of solder balls 560, is then mounted on the PWB 550 followed by a reflow process at the board level. This interconnects the CSP, i.e., the exposed portion of the array solder bumps 520, to the PWB 550.

This invention has many advantages. One such advantage is enhanced miniaturization. The absence of a substrate reduces the size of the inventive CSP package so that it is truly a chip-size package. Another advantage is simplicity of manufacturing. All the processes used in making the inventive CSP are established practices in electronic packaging. Furthermore, the inventive CSP and method of making thereof have low cost, since there is no need for a substrate and other intermediate processes.

Finally, the above described embodiments of the present invention are intended to be illustrative only. Numerous alternative methods, structures and embodiments may be devised by those skilled in the art without departing from the spirit and scope of the following claims.

I claim:

1. A chip-sized package comprising:

a chip having an active surface;

chip ports arranged in an array on said active surface;

an encapsulant which encapsulates said chip and portions of said chip ports located nearest said active surface, portions of said chip ports which are located away from said active surface being exposed from said encapsulant;

a package port attached to the exposed portions of each chip port, wherein each package port is electrically connectable to a circuit board;

at least two frame tie-bars positioned opposite each other and not extending entirely across a surface of the chip; and a die attach which attaches the chip to the at least two frame tie-bars.

2. The chip-sized package of claim 1, wherein said frame tie-bar and said array chip ports are on opposite surfaces of said chip.

3. The chip-sized package of claim 1, wherein said encapsulant is an epoxy molding compound.

4. The chip-sized package of claim 1, wherein said array of chip ports comprises an array of conductive bumps or balls.

5. The chip-sized package of claim 1, wherein said array of chip ports comprises an array of metal bumps.

6. The chip-sized package of claim 1, wherein said array of chip ports comprises an array of conductive polymer bumps or balls.

7. The chip-sized package of claim 1, wherein said array of chip ports is an array of solder bumps.

8. The chip-sized package of claim 1, wherein said array of package ports is an array of conductive polymer bumps or balls.

9. The chip-sized package of claim 1, wherein said array of package ports is an array of solder bumps or balls.

10. The chip-sized package of claim 1, wherein the frame tie-bars are connected to an inactive surface of the chip.

* * * * *